United States Patent
Natarajan et al.

[11] Patent Number: 5,613,181
[45] Date of Patent: Mar. 18, 1997

[54] CO-SINTERED SURFACE METALLIZATION FOR PIN-JOIN, WIRE-BOND AND CHIP ATTACH

[75] Inventors: Govindarajan Natarajan; Srinivasa S. N. Reddy, both of Dutchess County, N.Y.

[73] Assignee: International Business Machines Corporation, Armonk, N.Y.

[21] Appl. No.: 360,526

[22] Filed: Dec. 21, 1994

[51] Int. Cl.$^6$ .................... B22F 7/02; B22F 7/04
[52] U.S. Cl. .................... 419/6; 419/8; 419/9
[58] Field of Search .................... 419/6, 8, 9; 428/547, 428/548, 552

[56] References Cited

U.S. PATENT DOCUMENTS

| | | | |
|---|---|---|---|
| H1448 | 6/1995 | Goode, Jr. | 428/552 |
| 3,770,874 | 11/1973 | Krieger et al. | 174/68.5 |
| 4,025,997 | 5/1977 | Gernitis et al. | 428/621 |
| 4,057,777 | 11/1977 | Merz et al. | 338/309 |
| 4,234,367 | 11/1980 | Herron et al. | 156/89 |
| 4,413,061 | 11/1983 | Kumar et al. | 501/7 |
| 4,808,770 | 2/1989 | Prabhu et al. | 174/68.5 |
| 4,816,615 | 3/1989 | Prabhu et al. | 174/68.5 |
| 5,004,653 | 4/1991 | Kroisenbrunner | 428/615 |
| 5,035,957 | 7/1991 | Bartlett et al. | 428/552 |
| 5,073,180 | 12/1991 | Farooq et al. | 65/18.4 |
| 5,167,913 | 12/1992 | Acocella et al. | 419/7 |
| 5,216,207 | 6/1993 | Prabhu et al. | 174/256 |
| 5,236,787 | 8/1993 | Grassi | 428/552 |
| 5,358,793 | 10/1994 | Hanada et al. | 428/560 |
| 5,405,707 | 4/1995 | Tani et al. | 428/551 |
| 5,422,190 | 6/1995 | Alexander | 428/552 |
| 5,495,978 | 3/1996 | Muth | 228/122.1 |

OTHER PUBLICATIONS

Haddad, "Metallizing Multilayer Ceramic Top and Bottom Side", IBM Technical Disclosure Bulletin, V16 N11, dtd Apr. 1974, p. 3612.

*Primary Examiner*—Charles T. Jordan
*Assistant Examiner*—Daniel Jenkins
*Attorney, Agent, or Firm*—Whitham, Curtis, Whitham & McGinn; Ira Blecker

[57] ABSTRACT

A co-sintered ceramic substrate structure is formed through punching and screening of a plurality of ceramic green sheets with a plurality of composite metal pastes and/or inks and laminating the structure. The co-sintered surface metallization comprises dual screened composite metal pastes, one on top of the other and bonded to the sintered ceramic substrate to provide bonding of the surface metallization to the sintered ceramic substrate.

7 Claims, 1 Drawing Sheet

CO-SINTERED SURFACE METALLIZATION FOR PIN-JOIN, WIRE-BOND AND CHIP ATTACH

BACKGROUND OF THE INVENTION

1. Field of the Invention

The present invention generally relates to the field of pin joining, wire bonding and chip attachment to ceramic structures, and their manufacture, and more particularly to multilayer ceramic substrates for mounting semiconductor devices. In such applications, co-sintering the surface metallization to facilitate direct pin joining, wire bonding and chip attachment hold significant advantages.

2. Description of the Prior Art

The current art for surface metallization of glass ceramic is done by lithography and thin film evaporation and sputtering on planarized surfaces. The need for a planar surface for lithography and thin film processes warrants surface machining of sintered ceramic, and such planarization processes are very expensive manufacturing operations.

For substrates having alumina as the ceramic, the metallization is usually molybdenum (Mo) or tungsten (W). The surface metal features are bonded to the ceramic by the addition of glasses. Subsequent joining of pins, wires and chips to these refractory metal features is done after plating of nickel on Mo-glass or W-glass composite.

In the case of low temperature sinterable glass ceramics, the metallic conductors used are traditionally copper, silver or gold. The bonding of surface metal features to glass ceramic substrates is more difficult due to large thermal expansion mismatch between the substrate and the metal. One approach for surface metallization of glass ceramic is to deposit thin film features either by evaporation or sputtering. This requires planar surfaces and hence involves surface machining which makes it very expensive. Various glass ceramic compositions are disclosed in U.S. Pat. No. 4,413,061 to Kumar et al. Sintering cycles using hydrogen and water vapor have been taught in U.S. Pat. No. 4,234,367 to Herron et al. This is done at low temperatures to remove binders.

SUMMARY OF THE INVENTION

It is therefore an object of the present invention to provide co-sintered surface metallization on ceramic substrate surfaces and methods of manufacturing the same for use in electronic applications.

It is another object of the present invention to provide surface metallization on ceramic substrates without expensive lapping and polishing.

It is further an object of the present invention to provide a method for achieving direct pin-attach, wire-bond and chip-attach, such that surface finishing of the sintered ceramic and/or lithographic or thin film metallization is eliminated.

According to the invention, a co-sintered ceramic substrate structure is formed through punching and screening of a plurality of ceramic green sheets with a plurality of composite metal pastes and/or inks and laminating the structure. A glass ceramic substrate comprising a metal paste of 40% by volume of copper and 60% by volume of glass as disclosed in U.S. Pat. No. 5,073,180 to Farooq et al., the disclosure of which is incorporated by reference herein, is preferably used in a first layer. A second layer including nickel is applied over the first layer. The co-sintered surface metallization comprises dual screened composite metal pastes, one on top of the other and bonded to the sintered ceramic substrate. Accordingly, it is yet another object of the present invention to provide bonding of the surface metallization to the sintered ceramic substrate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
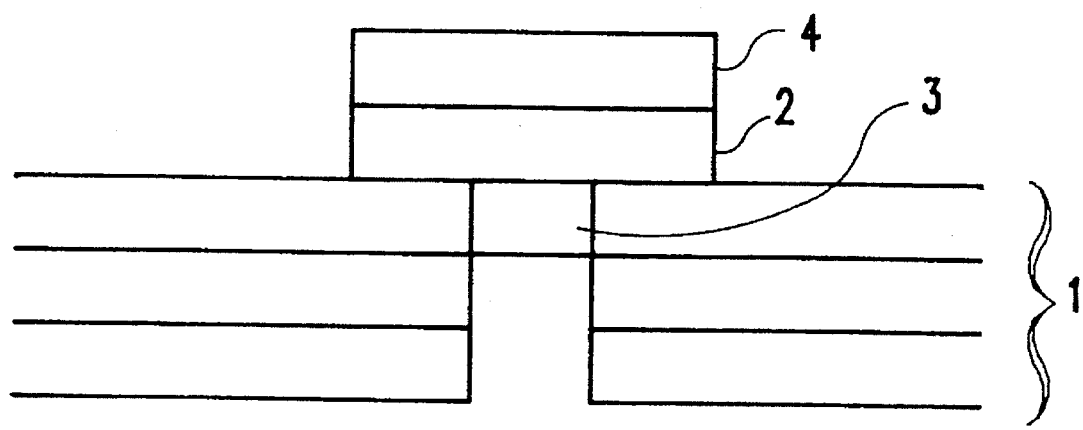
FIG. 1 is a cross-sectional view showing a stack of ceramic green sheets with top ceramic layer screened first with composite metal paste for surface metallization followed by a second surface metal paste.

Referring now to the drawings, and more particularly to FIG. 1, there is shown a plurality of ceramic green sheets 1, which are punched forming vias and screened with metal pastes for electronic applications forming a capture pad. A copper/glass composite paste, such as has been disclosed in U.S. Pat. No. 5,073,180 to Farooq et al., has been screened onto the green sheets 1 partially filling the punch hole 3 and forming a first layer 2. A second layer 4 of metal paste is deposited on top of the first layer 2. Table 1 below outlines 3 combinations of which the first and second layers may consist. In Table 1, the preferred composition of the first layer is 40% by volume of copper and 60% by volume of glass of the glass/copper composite with copper and glass particle sizes taught in the patent to Farooq et al.

TABLE 1

| combination | first layer | second layer | bonding atmosphere |
|---|---|---|---|
| 1 | screened glass/copper composite | screened nickel paste | 99% steam 1% hydrogen |
| 2 | screened glass/copper composite | screened (vol. %) copper (88%) and nickel (12%) paste | 99.75% steam 0.25% hydrogen |
| 3 | screened glass/copper composite | screened (vol. %) copper (80%) and nickel (20%) paste | 99.5 % steam 0.5% hydrogen |

The pastes which comprise the first and second layers are composed of substances which may have different coefficients of expansion from the ceramic green sheet. The first layer is formulated such that it remains bonded (in contact) with the ceramic after sintering and no gaps are formed between the ceramic and the first layer. The first layer, because of its composite nature, is closer in coefficient of expansion to that of the glass-ceramic. The second layer is likewise formed with respect to the first layer, so that there may be a gradation of coefficients of expansion between the ceramic green sheet and the second layer, but the three materials remain in one structure after sintering. (For example, the coefficient of expansion of glass-ceramic is 3 ppm/°C. and that of glass-ceramic/copper composite is about 7 ppm/°C. The coefficient of expansion of the second layer is in the 13 to 18 ppm/°C. range.)

After the first and second layer pastes are applied, the structure thus far is sintered. Generally speaking, the sintering procedure is done according to the teachings of Farooq et al., U.S. Pat. No. 5,073,180, with a slight change necessary to accommodate the bonding of the first and second layers to the glass ceramic body. Briefly, the structure undergoes pyrolysis, binder burnoff, and densification according to Farooq et al. Then, the atmosphere is changed to one of the atmospheres as shown in Table 1 to accomplish sealing and recrystallization of the glass ceramic substrate and bonding of the surface metallization. This bonding atmosphere is somewhat different from the sealing atmosphere preferred in Farooq et al. Thereafter, the structure is cooled.

The bonding atmosphere is specifically chosen to provide an environment in which residual oxide remains to promote bonding. Changes made in the bonding atmosphere could result in no bonding occurring.

Figure 2:
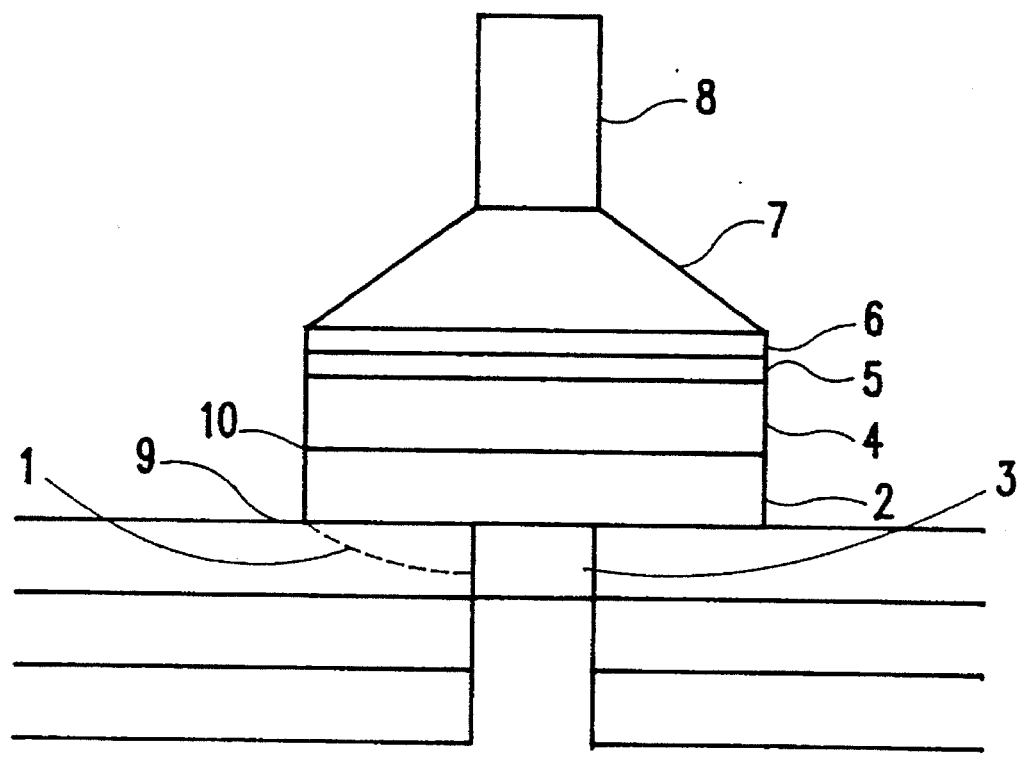
FIG. 2 is a cross-sectional view showing a sintered ceramic substrate with the co-sintered surface metallization and pin attached metal structure.

FIG. 2 shows the invention with the co-sintered surface metallization and pin attached. As can be seen in the figure, there is an additional very thin layer of plated gold 5 having thickness of about 1000 Å. The pin head 7 is attached with solder 6, which may be 95% tin and 5% antimony or lead-tin solder.

The invention was tested with a standard pin-pull test. Table 2 shows the results of the pin-pull test.

TABLE 2

| Structure type | pin-pull, lbs | Total pins |
|---|---|---|
| 1 | 11.2 ± 0.9 | 90 |
| 2 | 10.7 ± 1.0 | 104 |
| 3 | 12.0 ± 0.8 | 70 |

It is best if failure does not occur in the ceramic. With the present invention, failure is expected at four points:
1. At the interface between the ceramic and the copper glass composite 9.
2. At the interface between the copper/glass composite and the copper/nickel or nickel film 10.
3. In the glass ceramic 1.
4. In the pin shank 8.

It is most desirable that failure occur in the pin shank 8. If failure occurs in the pin shank or solder, the solder can be cleaned out and an new pin added. If the gold layer is pulled off, it can be added again followed by replacing the pin and solder. Failure at other interfaces will require the structure to be built again. Failure in this glass ceramic 1 cannot be repaired, thereby necessitating the disposal of the glass-ceramic body. Failure of the structure according to this invention was most often observed at the interface between the copper/glass composite and nickel or copper/nickel film 10. Failure in the pin shank occurs at about 12.5 pounds of force. However, the strengths as shown by Table 2 above were high. No failure was observed in the interface between the ceramic and the copper glass composite 9 or the glass ceramic 1.

The invention is formed by providing ceramic green sheets, stacked and punched. Screening a paste of glass ceramic/copper composite onto the stacked green sheets. Screening a paste of nickel or copper/nickel alloy on the composite. Sintering the structure so that the composite has a total thickness of 6–20 microns and the nickel layer has a total thickness of 6–20 microns. The structure is plated with gold after sintering. The structure is then ready for pin joining, wire bonding, and chip attach. The steps of producing this structure do not require planarization.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of providing surface metallization on a ceramic structure used for pin-joining, wire bonding, and chip attach comprising the steps of:

depositing first and second layers over metallization formed in a ceramic on a surface of said ceramic at a site where a metal component is to be bonded to said ceramic, said first layer being a paste of glass-ceramic/copper composite and said second layer being a metal paste containing nickel;

sintering said ceramic after said step of depositing to form a glass-ceramic substrate having a structure comprised of a first layer of glass-ceramic/copper composite and a second layer of nickel-containing metal;

plating said nickel-containing metal with nickel/gold alloy or gold; and diffusion annealing the resulting structure.

2. A method of providing surface metallization as in claim 1 wherein the coefficient of expansion of the glass-ceramic substrate is about 3 ppm/°C., the coefficient of expansion of the glass-ceramic/copper composite is about 7 ppm/°C. and the coefficient of expansion of the nickel-containing metal is in the range of 13 to 18 ppm/°C.

3. A method of providing surface metallization as in claim 1 wherein said metal paste is a nickel paste.

4. The method of claim 1 further comprising the step of stacking punched green sheets to form said ceramic structure, and wherein said depositing step is performed over punched regions in said green sheets.

5. A method of providing surface metallization as in claim 1 wherein said metal paste is a copper and nickel mixture wherein the volume percent of copper is in the range of 80 to 88% and the volume percent of nickel is in the range of 20 to 12%.

6. A method of providing surface metallization as in claim 5 wherein said metal paste is composed of 88% by volume of copper and 12% by volume of nickel.

7. A method of providing surface metallization as in claim 5 wherein said metal paste is composed of 80% by volume of copper and 20% by volume of nickel.

* * * * *